United States Patent
Nagai

(10) Patent No.: US 7,706,197 B2
(45) Date of Patent: Apr. 27, 2010

(54) STORAGE DEVICE AND CONTROL METHOD OF STORAGE DEVICE

(75) Inventor: Kenji Nagai, Gifu-ken (JP)

(73) Assignee: Spansion LLC, Sunnyvale, CA (US)

( * ) Notice: Subject to any disclaimer, the term of this patent is extended or adjusted under 35 U.S.C. 154(b) by 329 days.

(21) Appl. No.: 11/510,077

(22) Filed: Aug. 25, 2006

(65) Prior Publication Data

US 2007/0047342 A1 Mar. 1, 2007

Related U.S. Application Data

(63) Continuation-in-part of application No. PCT/JP2005/015416, filed on Aug. 25, 2005.

(51) Int. Cl.
*G11C 29/00* (2006.01)
*G11C 8/12* (2006.01)

(52) U.S. Cl. .................................. 365/200; 365/230.03

(58) Field of Classification Search ................. 365/200, 365/185.09, 185.11, 230.03
See application file for complete search history.

(56) References Cited

U.S. PATENT DOCUMENTS

| | | | |
|---|---|---|---|
| 5,500,821 A | 3/1996 | Tanaka | 365/200 |
| 5,566,386 A * | 10/1996 | Kumakura et al. | 365/226 |
| 5,905,681 A | 5/1999 | Matsui | 365/200 |
| 6,166,973 A | 12/2000 | Shinozaki | 365/200 |
| 6,185,137 B1 | 2/2001 | Sato et al. | 365/200 |
| 6,381,191 B2 * | 4/2002 | Ooishi | 365/230.03 |
| 6,803,265 B1 * | 10/2004 | Ngo et al. | 438/188 |
| 6,865,133 B2 | 3/2005 | Tsukidate et al. | 365/230.01 |
| 6,888,764 B2 | 5/2005 | Shiga et al. | 365/200 |
| 6,956,777 B2 | 10/2005 | Komura et al. | 365/200 |
| 2002/0105840 A1 * | 8/2002 | Ikeda et al. | 365/200 |
| 2002/0141264 A1 * | 10/2002 | Mori et al. | 365/201 |
| 2003/0064564 A1 * | 4/2003 | Lin | 438/257 |
| 2005/0002243 A1 * | 1/2005 | Mohr et al. | 365/200 |

* cited by examiner

*Primary Examiner*—VanThu Nguyen
*Assistant Examiner*—Douglas King

(57) ABSTRACT

In a storage device having a redundancy remedy function in a block unit having a memory cells array divided in plural blocks, prior to the access operation to individual memory cells in the block, the block address BA for specifying a block is entered, and block redundancy is determined in the entered block address BA, and hence it is not necessary to determine input or redundancy of the block address BA on every occasion of the access operation. As a result, the time to the access operation start to the memory cell can be shortened, and the access speed is enhanced.

17 Claims, 9 Drawing Sheets

| BUS CYCLE | FIRST CYCLE | | SECOND CYCLE | | THIRD CYCLE | |
|---|---|---|---|---|---|---|
| TERMINAL | ADDRESS (ADD) | DATA (IO) | ADDRESS (ADD) | DATA (IO) | ADDRESS (ADD) | DATA (IO) |
| ENTRY COMMAND | 555h | AAh | 2AAh | 55h | 555h | 93h |
| WRITE COMMAND | XXh | A0h | 00h | BAin | / | / |
| EXIT COMMAND | XXh | 90h | XXh | 00h | / | / |

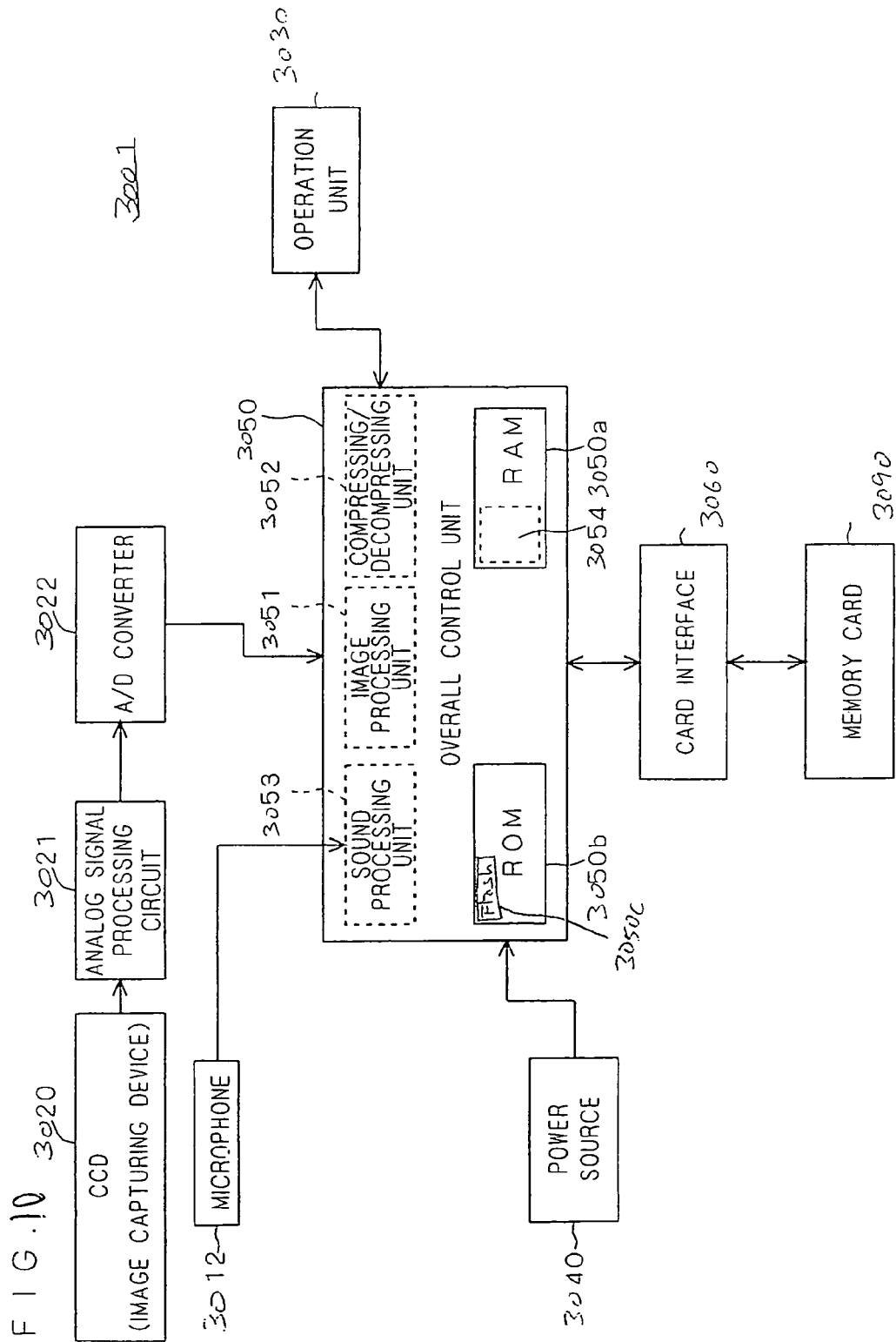

STORAGE DEVICE AND CONTROL METHOD OF STORAGE DEVICE

CROSS-REFERENCES TO RELATED APPLICATIONS

This is a continuation in part of International Application No. PCT/JP2005/015416 filed Aug. 25, 2005, which was not published in English under PCT Article 21(2).

TECHNICAL FIELD

The invention relates to a storage device having a redundancy remedy function of a faulty memory cell, and a control method of the storage device, and more particularly to a storage device for redundancy remedy in one unit of an access control region of a plurality of memory cells, and a control method of the storage device.

SUMMARY

This Summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

It is an object to present a storage device shortened in access start time by determining redundancy prior to an access operation to individual memory cell belonging to the access control region, in the event of redundancy remedy in one unit of an access control region by defining the access control region in a plurality of memory cells, and a control method of the storage device.

To achieve the above object, according to the present invention, there is provided a control method in a storage device that comprises a memory cell array comprised of a plurality of blocks, and a redundancy remedy circuit processing a redundancy remedy in each block as one unit for access control, the control method comprising the steps of:

prior to an access operation for an individual memory cell, inputting a block address specifying at least one of the blocks; and processing a redundancy determination on the input block address.

In the control method of the storage device of the invention, in the storage device having a plurality of blocks of redundancy remedy function as one unit of an access control, redundancy is determined by entering a block address for specifying at least one block, prior to the access operation to individual memory cells.

In addition, according to the present invention, there is provided a storage device that comprises a memory cell array comprised of a plurality of blocks, and a redundancy remedy function processing a redundancy remedy in each block as one unit for access control, the storage device comprising:

a first block address buffer for storing at least one of the block addresses input in accordance with a specified command cycle prior to an access operation for an individual memory cell; and a block redundancy determination section processing redundancy determination in accordance with input of the block address.

The storage device of the invention is a storage device having a plurality of blocks of redundancy remedy function as one unit of access control, at least one block address is stored in a first block address buffer depending on an exclusive command cycle prior to the access operation to individual memory cells, and the redundancy of block address is determined by the block redundancy determination section.

Accordingly, prior to the access operation to individual memory cells in the block, a block address is entered, and the redundancy of the entered block address can be determined at the same time. When starting access to individual memory cells, decision of necessity of block redundancy or redundancy remedy if redundancy is necessary has been already finished. It is hence not required to determine redundancy in the object block of access on every occasion of the access operation to memory cells in a selected block, and it is not required to consider the time for determining redundancy as the access time. As a result, the time from access request to start of the access operation can be shortened.

Moreover, since the block address is entered prior to access start to individual memory cells, the block address can be entered from the address terminal or data input and/or output terminal used when starting access to individual memory cells. Exclusive address terminal is not needed for input of the block address, and the number of terminals in the storage device can be curtailed.

BRIEF DESCRIPTION OF THE DRAWINGS

FIG. 10 illustrates an exemplary digital camera, in accordance with an embodiment of the present claimed subject matter.

DETAILED DESCRIPTION

Figure 1:
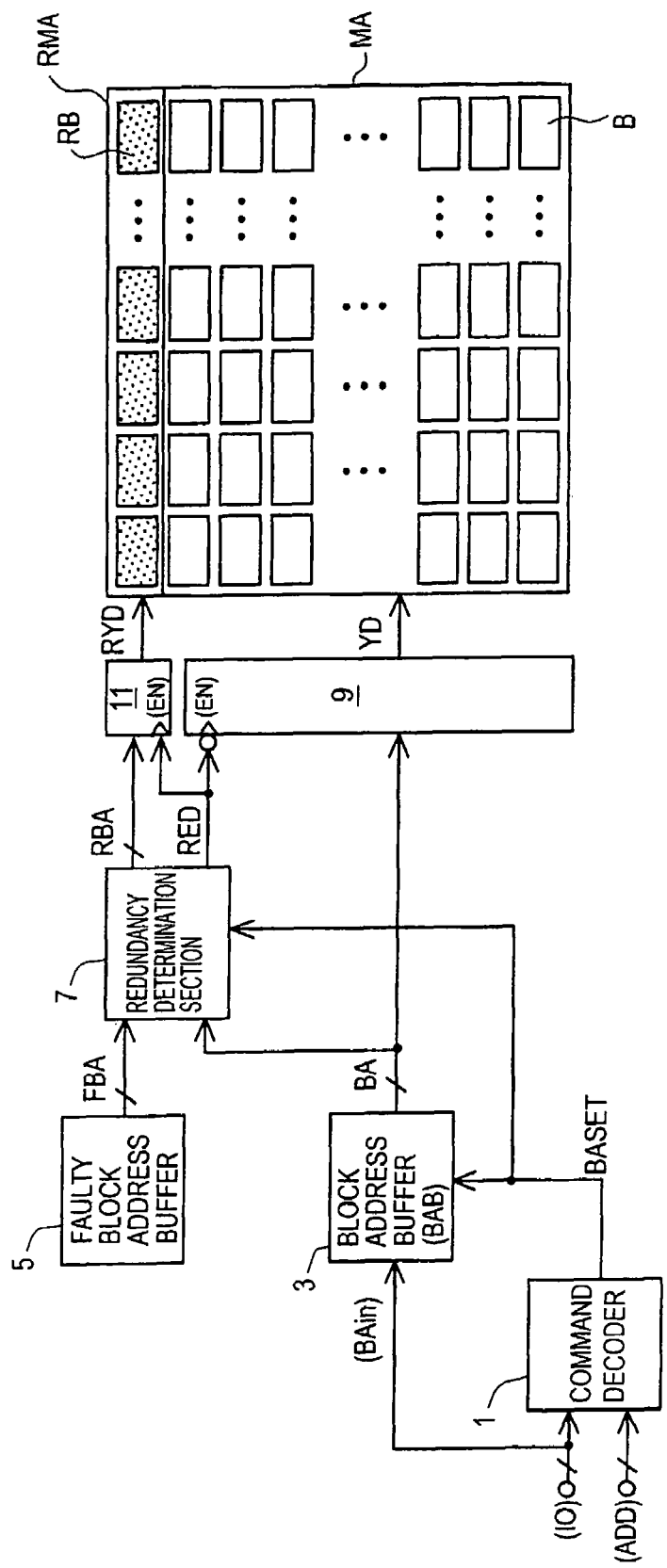
FIG. 1 is a circuit block diagram, in accordance with an embodiment of the present claimed subject matter.

Reference will now be made in detail to embodiments of the present claimed subject matter, examples of which are illustrated in the accompanying drawings. While the claimed subject matter will be described in conjunction with these embodiments, it will be understood that they are not intended to limit the claimed subject matter to these embodiments. On the contrary, the claimed subject matter is intended to cover alternatives, modifications and equivalents, which may be included within the spirit and scope of the claimed subject matter as defined by the appended claims. Furthermore, in the following detailed description of the present claimed subject matter, numerous specific details are set forth in order to provide a thorough understanding of the present claimed subject matter. However, it will be evident to one of ordinary skill in the art that the present claimed subject matter may be practiced without these specific details. In other instances, well known methods, procedures, components, and circuits have not been described in detail as not to unnecessarily obscure aspects of the claimed subject matter.

In a semiconductor device disclosed in Unexamined Japanese Patent Application Publication No. 2003-77293 (FIG. 1), an address control circuit 20 is applied in a memory section having eight blocks BLK0 to BLK7, and two redundant blocks RD0 and RD1. A block address entered from an address pad is sent to a block address decoder 24 and a redundant block determination circuit 26 by way of an address counter 22.

When the block address is not a faulty block address, the redundant block use instruction signal HIT issued from the redundant block determination circuit 26 becomes "L" level. It is controlled so that only the block corresponding to the block address may be selected by a block selection control section 30.

When the block address is a faulty block address, the redundant block use instruction signal HIT issued from the redundant block determination circuit 26 is "H" level. By the block selection control section 30, blocks BLK0 to BLK7 are not selected forcibly. A redundant block to replace the faulty block address is selected.

In the semiconductor device disclosed in the above-mentioned Unexamined Japanese Patent Application Publication No. 2003-77293 (FIG. 1), however, upon every access, address information including a block address is entered from address pads, and sent into the redundant block determination circuit 26. In the redundant block determination circuit 26, any one of eight blocks BLK0 to BLK7 specified by a block address is determined to be a faulty block or not. If it is determined as a faulty block, it is replaced with either one of two redundant blocks RD0 and RD1.

On every occasion of access, in the block specified by the entered block address, replacement with a redundant block must be determined, and during replacement determination process, the access operation cannot be advanced. The access time includes replacement determination time to a redundant block, and the replacement determination time may be restricted when shortening the access start time.

An exemplary embodiment of a storage device and control method of the storage device of the invention is specifically described below while referring to FIG. 1 to FIG. 6.

In the storage device of the invention, when information of access to the memory cell is entered from an external terminal of storage device, it leads to an external access operation for issuing memory cell information to the external terminal, and an internal access operation for receiving information of access to the memory cell from the external terminal of the storage device, but not issuing memory cell information to the external terminal. The external access operation is, for example, a read access operation of receiving an address and issuing memory cell information, and the internal access operation corresponds to an erasing operation or a program operation of a nonvolatile storage device such as a flash memory, or a refresh operation of a or a refresh operation of a volatile storage device such as a DRAM.

In FIG. 1, a memory cell array MA is divided into blocks B as memory cell regions by every specified number of memory cells. Adjacently to the memory cell array MA, a redundant memory cell array RMA is provided. The redundant memory cell array RMA has redundant blocks RB as redundant memory cell regions by every specified number of redundant memory cells. The block B including a faulty memory cell is replaced by a redundant block RB. This structure has the so-called block redundant function.

FIG. 1 shows a circuit structure in which redundancy is determined preliminarily by entering the block address BA necessary for the external access operation prior to the access operation to individual memory cells.

A data input and output terminal (IO) and an address terminal (ADD) are connected to a command decoder 1. In a command cycle, various commands entered from the data input and output terminal (IO) and/or the address terminal (ADD) are decoded. The data input and output terminal (IO) is connected to a block address buffer (BAB) 3. As described below, in the command cycle, the block address entered from the data input and output terminal (IO) is stored in the block address buffer (BAB) 3. The storing timing depends on the block address set signal BASET issued from the command decoder 1.

The block address set signal BASET is issued, in the command cycle as described below, as decoded result of a command signal entered from the data input and output terminal (IO) and/or the address terminal (ADD), together with the block address entered from the data input and output terminal (IO).

At the same time, the block address set signal BASET is also entered in a redundancy determination section 7 as a timing signal for determining redundancy. In the redundancy determination section 7, the block address BA is entered from the block address buffer (BAB) 3, and a faulty block address faulty block address FBA preliminarily stored in a faulty block address buffer 5 is entered. Depending on the block address set signal BASET, it is determined if the block address BA may coincide with the faulty block address FBA or not. As a result of redundancy determination, if the block address BA coincides with the faulty block address FBA, a coincidence determination signal RED of high level is issued, and if not coinciding, a coincidence determination signal RED of low level is issued, from the redundancy determination section 7 toward an enable terminal (EN) of a block address decoder 9 and a redundant block address decoder 11.

In this case, the block address decoder 9 is activated when a signal of low level is entered in the enable terminal (EN), and the redundant block address decoder 11 is activated when a signal of high level is entered in the enable terminal (EN).

That is, in the case of the coincidence determination signal RED of low level, the block address BA entered in the block address decoder 9 is decoded, and the block B in the memory cell array MA is selected as a decoded signal YD. In the case of the coincidence determination signal RED of high level, the redundant block address RBA issued from the redundancy determination section 7 and entered in the redundant block address decoder 11 is decoded, and the redundant block RB in the redundant memory cell array RMA is selected as the redundant decoded signal RYD.

Depending on the block address set signal BASET issued from the command decoder 1 in the command cycle, the block address is stored in the block address buffer (BAB) 3, and redundancy of the stored block address BA is determined in the redundancy determination section 7. As a result, in the access operation, the access object block B has been already established in the block address buffer (BAB) 3. Further, redundancy has been already determined on the stored block address BA, and, as required, the access object has been already remedied of redundancy by the redundant block RB. redundant block RB. The access operation is executed on the block B corresponding to the stored block address BA, or on the redundant block RB remedied of redundancy. Herein, the block address buffer (BAB) 3 is an example of a first block address buffer, and the redundancy determining section 7 is an example of the block redundancy determination section.

Although not shown in FIG. 1, the memory cell is established by the address for selecting a word line or the like in the block, and the address decoder. On every occasion of the access operation, it is not required to decode by entering the block address BA, and determining process of redundancy is not needed. As a result, the time to start of the access operation to the memory cell can be shortened, and the access speed is enhanced. The memory controller (not shown) of the memory system mounting such storage device has only to issue a command cycle only once for setting the block address BA described below, and it is enough only by entering an arbitrary address in the block in every access operation as far as the block address BA of the memory cell array region of desired external access remains unchanged, and the block address is opened for the period, and processing time can be assigned for selecting a different block from the block of present access operation. That is, the memory controller is not required to continue to hold the block address BA in the memory controller, and the process for establishing the block address for changing the block may be advanced in time, so that the system is higher in speed.

Figures 2, 3:
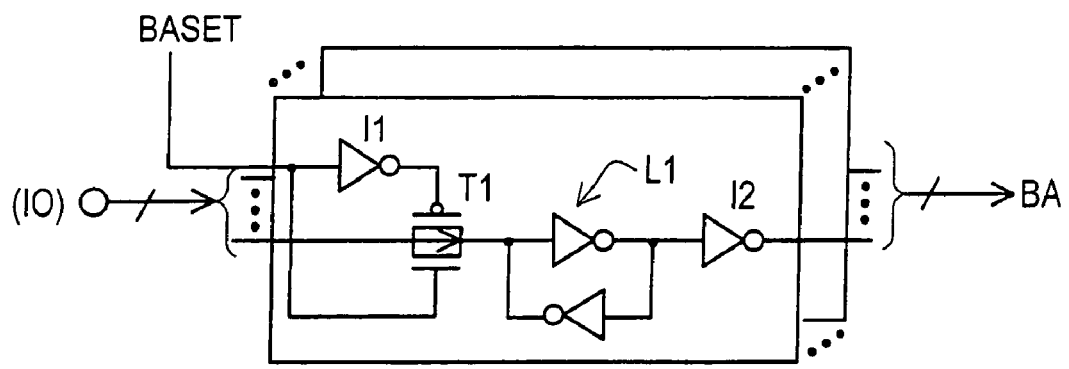
FIG. 2 is a diagram showing commands when setting a block address, upon which embodiments can be implemented.
FIG. 3 is a circuit example of a block address buffer, upon which embodiments can be implemented.

FIG. 2 is a block diagram of the command system for setting the block address BA. In the command cycle prior to the access operation to individual memory cells, this is a command for setting the block B as an object of access in a series of the access operation described later. A command and the block address BAin are entered depending on the combination of signals entered from the address terminal (ADD) and the data input and output terminal (IO).

First, as an entry command, a signal set of three cycles is entered. In a first cycle, a code of 555h is entered from an address terminal (ADD), and a code of AAh is entered from the data input and output terminal (IO). In a second cycle, a code of 2AAh is entered from the address terminal (ADD), and a code of 55h is entered from the data input and output terminal (IO), and in a third cycle, a code of 555h is entered from the address terminal (ADD), and a code of 93h is entered from the data input and output terminal (IO). Combination of these codes is decoded in the command decoder 1, and entry of the block address BAin in the command cycle is recognized.

Next, the block address BAin is entered by a write command. In the first cycle, a code of XXh is entered from the address terminal (ADD), and a code of A0h is entered from the data input and output terminal (IO), and in a second cycle, a code of 00h is entered from the address terminal (ADD), and the block address BAin is entered from the data input and output terminal (IO). Consequently, in the command decoder 1, the signal entered from the data input and output terminal (IO) in the second cycle is recognized to be the block address BAin, and the block address set signal BASET is issued for incorporating the block address BAin into the block address buffer (BAB) 3.

Further, an exit command is issued. In the first cycle, the code of XXh is entered from the address terminal (ADD), and a code of 90h is entered from the data input and output terminal (IO), and in the second cycle, the code of XXh is entered from the address terminal (ADD), and the code of 00h is entered from the data input and output terminal (IO). Combination of these codes is decoded by the command decoder 1, and it is recognized that the block address BAin exits from the command cycle.

FIG. 3 is a circuit example for storing one bit of the block address buffer (BAB) 3. Conduction of a transfer gate T1 is controlled by the block address set signal BASET and an inverted signal by an inverter gate 11. The transfer The transfer gate T1 is connected between the data input and output terminal (IO) and a latch circuit L1. An output of latch circuit L1 is issued as the block address BA by way of an inverter gate 12.

Depending on the block address set signal BASET of high level, the transfer gate T1 is turned on to conduct, and the block address BAin entered in the data input and output terminal (IO) is incorporated in the latch circuit L1. In the subsequent access operation, since the block address set signal BASET is maintained at low level, the contents in the latch circuit L1 are held, and the output state of the block address BA is maintained by way of an inverter gate 12. The block address BA information of the latch circuit L1 is maintained until the entry command/write command is entered.

Figure 4:
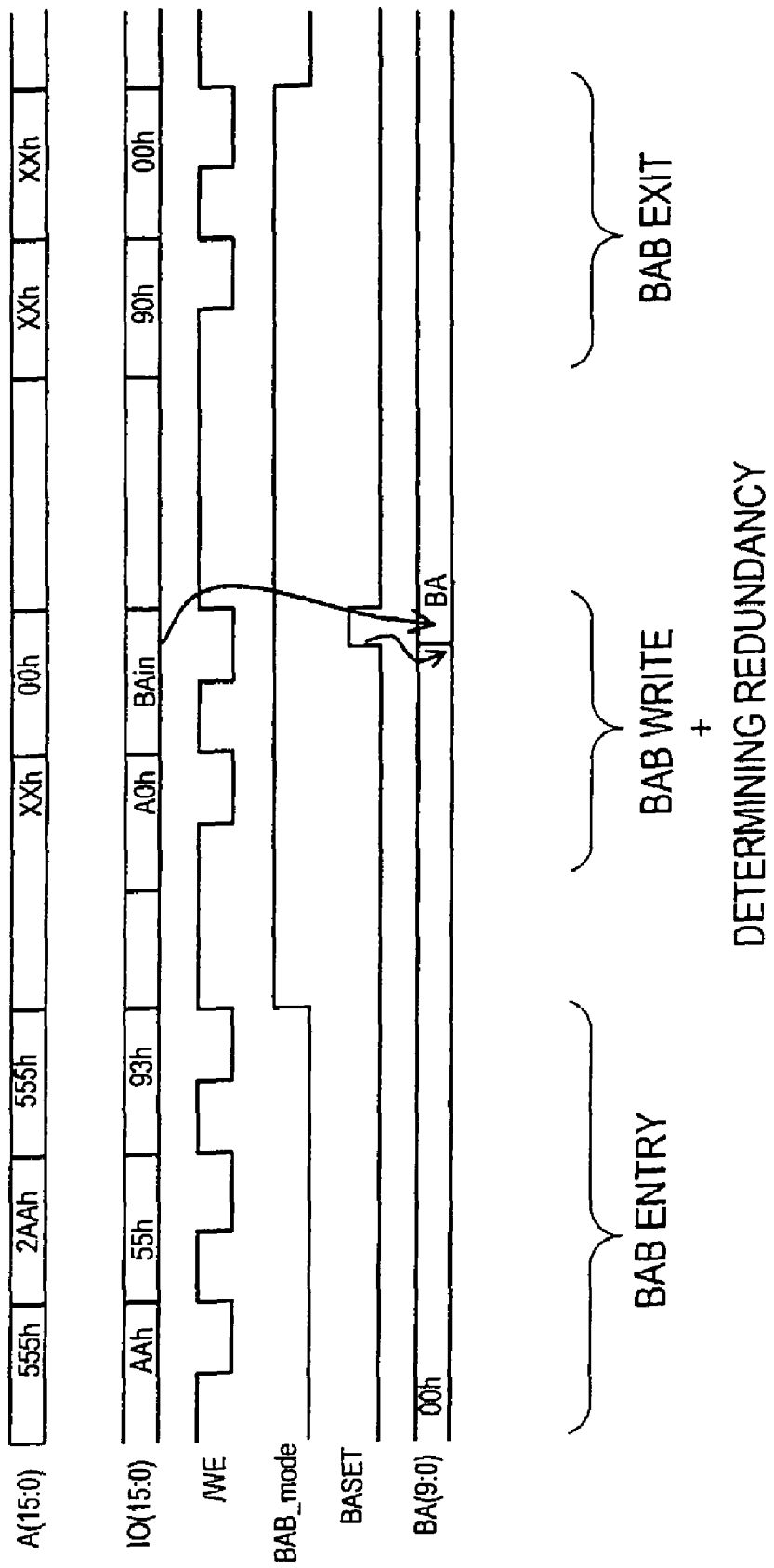
FIG. 4 is a timing chart when setting the block address, upon which embodiments can be implemented.

FIG. 4 is a timing chart of a command cycle for setting the block address BA. The command code explained in FIG. 2 is issued in synchronism with low level signal of a write enable signal /WE. The entry command is decoded by the command decoder 1, and block address set mode signal BAB_mode is changed to high level. It is informed that the block address is in set command state. Further, a write command of the block address BAin of two cycles is issued in synchronism with low level signal of the write enable signal /WE. The write command is decoded by the command decoder 1, and the block address set signal BASET is issued as a pulse signal of high level. In the block address buffer (BAB) 3, the block address BAin entered in the data input and output terminal (IO) is incorporated, and the block address BA is held. After the block address BA is held, an exit command of two cycles is issued in synchronism with low level signal of the write enable signal /WE. The exit command is decoded by the command decoder 1, and the block address set mode signal BAB_mode is changed to low level. This terminates the set command state of the block address.

Figure 5:
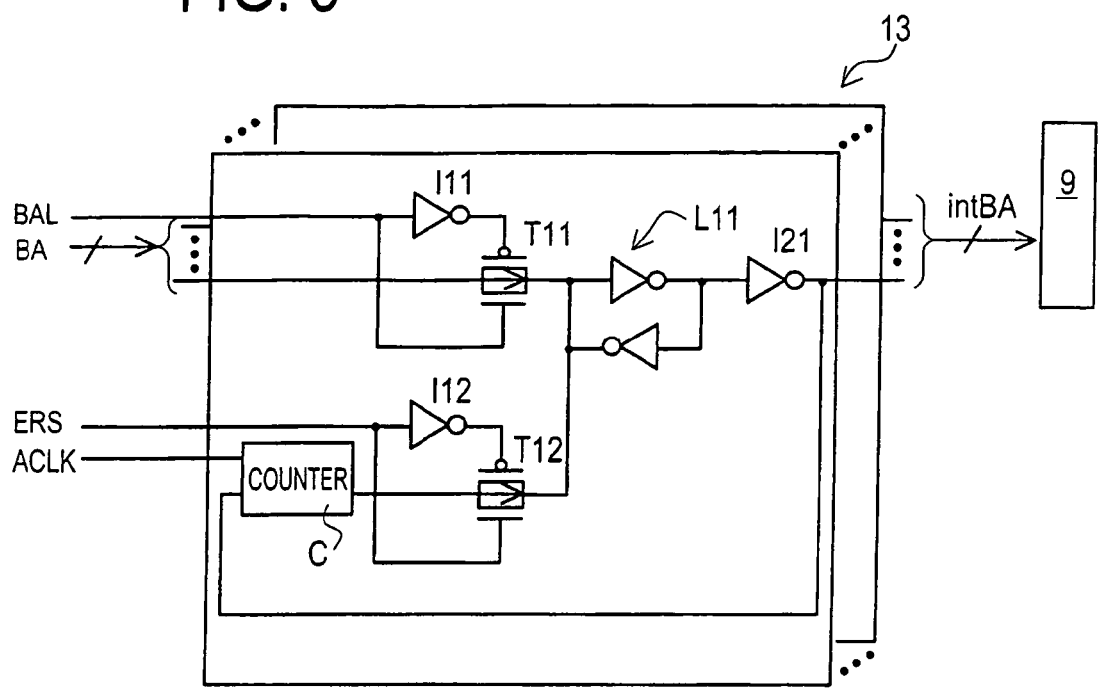
FIG. 5 is a circuit diagram of an address changeover buffer for controlling changeover of an address setting when suspending and resuming, upon which embodiments can be implemented.

FIG. 5 is a circuit diagram of an address changeover buffer 13 for controlling changeover of address setting when suspending and resuming. It is provided between the block address buffer (BAB) 3 and a block address decoder 9 in the circuit block diagram in FIG. 1. This is a circuit for controlling changeover of addresses in the case of having an interrupt function of a normal access operation of the external access operation to the block B instructed by the block address BA, during a continuous access operation as the internal access operation performed over blocks.

In the continuous access operation, regardless of the block address BA stored in the block address buffer (BAB) 3, block addresses necessary for internal access operation are sequentially increased or decreased. This is because access the operation continues over blocks. On the other hand, in the normal access operation, preliminarily, the block address BA of the block B of an object of access is stored in the block address buffer (BAB) 3, and the block B to be accessed is determined depending on this block address BA. Thus, when the suspend command which returned to normally access operation by means of suspend doing continuous access operation and the resume command which reverted in continuation access operation by releasing suspension entered, in these cases, a change of a block address is necessary.

The address changeover buffer 13 in FIG. 5 shows a nonvolatile storage device as an example of the storage device. That is, the continuous access operation is composed as an erasing operation of a block unit. The structure of the inverter gate I11, the transfer gate T11, the latch circuit L11, and the inverter gate I21 is the same as the structure of the block address buffer (BAB) 3 (see FIG. 3). Instead of the block address set signal BASET and the block address BAin in the block address buffer (BAB) 3, a block address latch signal BAL and the block address BA are entered, and instead of the block address BA in the block address buffer (BAB) 3, an internal block address intBA is issued. Herein, the block address latch signal BAL is a signal for issuing a pulse signal of high level when loading to the address level when loading to the address changeover buffer 13. In the command cycle, when the block address is set, in the normal access operation, a pulse is issued when the suspend command is issued in the midst of the continuous access operation.

Further, the counter C, the inverter gate I12, and the transfer gate T12 are provided, and the transfer gate T12 controls conduction between the counter C and the latch circuit L11. In the erase operation during the continuous access operation, by an erase command ERS of high level and a signal inverted by the inverter gate I12, the transfer gate T12 is turned on to conduct, and an output signal of the counter C is sent to the latch circuit L11. Herein, the counter C is an ordinary binary counter, and issues sequentially incremented bit signals depending on a timing signal ACLK. The timing signal ACLK is a signal issued upon completion of the erase operation of each block.

The counter C is an example of a second block address buffer, and inverter gates I11, I12, and transfer gates T11, T12 are examples of a changeover section.

Figure 6:
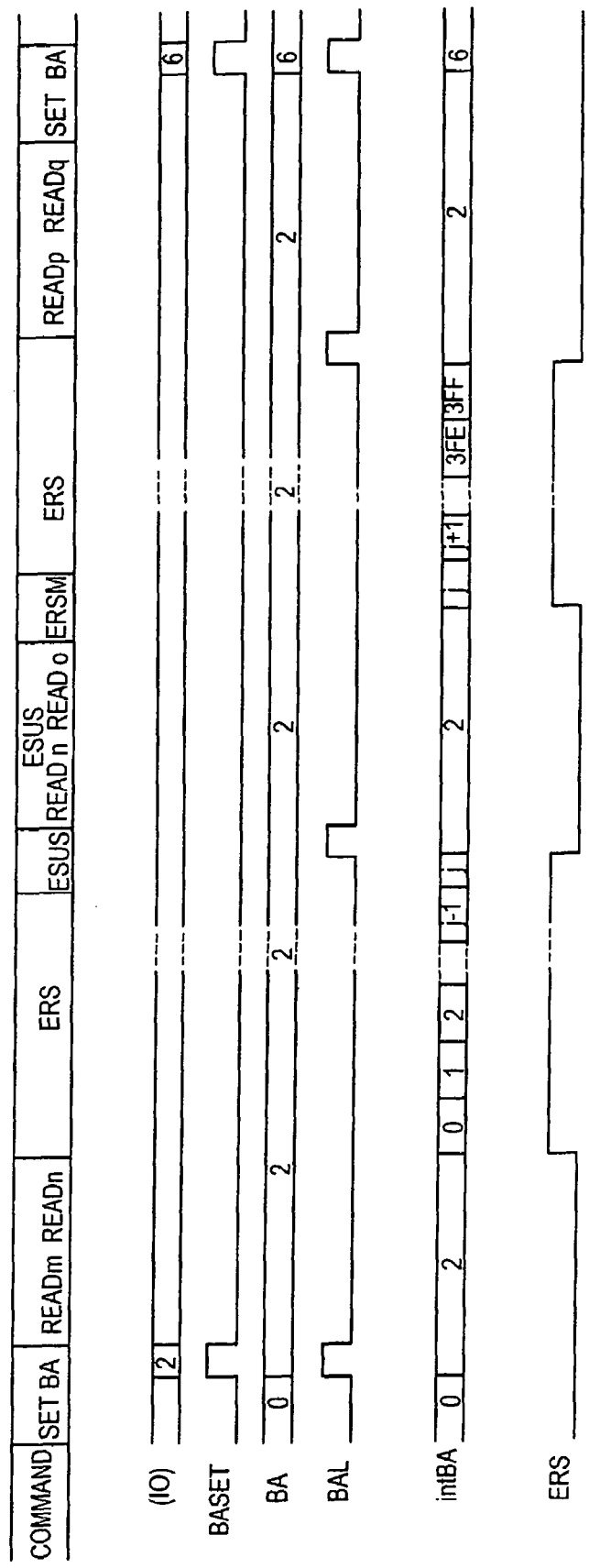
FIG. 6 is a timing chart of suspending and resuming, upon which embodiments can be implemented.

FIG. 6 is a timing chart showing the erase operation as the continuous operation, and changeover control of an address including the suspend command.

When a set command (SET BA) of the block address BA is instructed, "2" or "6" is entered from the data input and output terminal (IO) as the block address. At the same time, the block address set signal BASET issues a pulse signal of high level. Consequently, the block address BA is set to "2" or "6". At the same time, the block address latch signal BAL issues the pulse signal of high level. The block address BA is incorporated in the address changeover buffer 13 (FIG. 5), and "2" or "6" is issued as the internal block address intBA, and redundancy is determined at the same time.

When a read command (READm, n) as the normal access operation is is instructed, the address terminal (ADD) gives "m" and "n" as addresses in the block. In this case, since the internal block address intBA maintains "2", the block as an object of access is unchanged. The access time to the read command (READm, n) each has been already established in the block B as an object of access, and redundancy has been already determined, and therefore the word line in the selected block can be activated at high speed, and memory cell data information can be issued to the external terminal of the storage device at high speed.

When the erase command (ERS) as continuous access operation is instructed, in the address changeover buffer 13, the counter C and the latch circuit L11 are connected by way of the transfer gate T12 corresponding to the erase command ERS of high level. Depending on the timing signal ACLK, the output signal of the counter C incremented sequentially from "0" is issues as the internal block address intBA.

When the suspend command (ESUS) is instructed in the midst of the erase command (ERS), the block address latch signal BAL issues a pulse signal of high level, and the erase command ERS becomes low level. In the address changeover buffer 13, instead of the counter C, the block address BA is sent to the latch circuit L11 again. As internal block address intBA, "2" is set again, and redundancy is determined herein. Later, when the read command (READn, o) is instructed, addresses "n" and "o" are read corresponding to the block address BA ("2"). Each access time of the read command (READn, o) has been already established in the block B as an object of access, and redundancy has been already established, and therefore the word line in the selected word block can be activated at high speed, and memory cell data information can be issued to the external terminal of the storage device at high speed. At this time, the erase operation is suspended, and the timing signal ACLK is not changed, and the content in the counter C maintains "j" as the address before input of the suspend command (ESUS).

When read command (READn, o) by the suspend command (ESUS) during the erase command (ERS) is over, and the resume command (ERSM) for returning to the erase command (ERS) is instructed, the erase command ERS comes to high level again. At this time, the block address latch signal BAL is maintained at low level. In address changeover buffer 13, instead of the block address BA, the content of the counter C is sent again to the latch circuit L11. As the internal block address intBA, from "j" again, the value for incrementing sequentially is set depending on the timing signal ACLK.

After the erase operation of a block corresponding to a final block "3FF" as block address, when the block address latch signal BAL issues a pulse of high level, in the address changeover buffer 13, the block address BA is sent to the latch circuit L11. When "2" is set again as the internal block address intBA, redundancy is determined, and the operation returns to the ordinary access operation. When read commands (READP, q) are issued, addresses "p" and "q" in the block are entered from the address terminal (ADD). In this case, since "2" has been already set again in the internal block address intBA, the block as an object of access is unchanged. The addresses "p" and "q" in the block corresponding to the block address BA ("2") are read. The access time to read commands (READP, q) each has been already established in the block B as an object of access, and redundancy has been already determined, and therefore the word line in the selected block can be activated at high speed, and memory cell data information can be issued to the external terminal of the storage device at high speed.

As clear from the explanation herein, according to one embodiment, in command cycle prior to the access operation to individual memory cell in the block B, the block address BA is entered, and redundancy is determined in the entered block address BA. At the time of start of access to individual memory cells, necessity of block redundancy and redundancy remedy have been remedy have been already finished. Accordingly, in the memory cell in the selected block B, it is not required to determine redundancy of the block B as an object on every occasion of the access operation, and it is not required to consider redundancy determination time as an access time. Hence, the time from access request to the access operation can be shortened.

Moreover, since the block address BA is entered prior to start of access to the individual memory, input of the block address BA can be entered from the address terminal (ADD) or the data input and output terminal (IO) used in access start to individual memory cells. Any special address terminal (ADD) is not needed for input of the block address BA, and the number of terminals in the storage device can be curtailed.

Embodiments of the present claimed subject matter generally relates to semiconductor devices. More particularly, embodiments allow semiconductor devices to function with increased efficiency. In one implementation, the claimed subject matter is applicable to flash memory and devices that utilize flash memory. Flash memory is a form of non-volatile memory that can be electrically erased and reprogrammed. As such, flash memory, in general, is a type of electrically erasable programmable read only memory (EEPROM).

Like Electrically Erasable Programmable Read Only Memory (EEPROM), flash memory is nonvolatile and thus can maintain its contents even without power. However, flash memory is not standard EEPROM. Standard EEPROMs are differentiated from flash memory because they can be erased and reprogrammed on an individual byte or word basis while flash memory can be programmed on a byte or word basis, but is generally erased on a block basis. Although standard EEPROMs may appear to be more versatile, their functionality requires two transistors to hold one bit of data. In contrast, flash memory requires only one transistor to hold one bit of data, which results in a lower cost per bit. As flash memory costs far less than memory costs far less than EEPROM, it has become the dominant technology wherever a significant amount of non-volatile, solid-state storage is needed.

Examplary applications of flash memory include digital audio players, digital cameras, digital video recorders, and mobile phones. Flash memory is also used in USB flash drives, which are used for general storage and transfer of data between computers. Also, flash memory is gaining popularity in the gaming market, where low-cost fast-loading memory in the order of a few hundred megabytes is required, such as in game cartridges. Additionally, flash memory is applicable to cellular handsets, smartphones, personal digital assistants, set-top boxes, digital video recorders, networking and telecommunication equipments, printers, computer peripherals, automotive nagivation devices, and gaming systems.

As flash memory is a type of non-volatile memory, it does not need power to maintain the information stored in the chip. In addition, flash memory offers fast read access times and better shock resistance than traditional hard disks. These characteristics explain the popularity of flash memory for applications such as storage on battery-powered devices (e.g., cellular phones, mobile phones, IP phones, wireless phones.).

Flash memory stores information in an array of floating gate transistors, called "cells", each of which traditionally stores one bit of information. However, newer flash memory devices, such as MirrorBit Flash Technology from Spansion Inc., can store more than 1 bit per cell. The MirrorBit cell doubles the intrinsic density of a Flash memory array by storing two physically distinct bits on opposite sides of a memory cell. Each bit serves as a binary bit of data (e.g., either 1 or 0) that is mapped directly to the memory array.

Reading or programming one side of a memory cell occurs independently of whatever data is stored on the opposite side of the cell.

With regards to wireless markets, flash memory that utilizes MirrorBit MirrorBit technology has several key advantages. For example, flash memory that utilizes MirrorBit technology are capable of burst-mode access as fast as 80 MHz, page access times as fast as 25 ns, simultaneous read-write operation for combined code and data storage, and low standby power (e.g., 1 µA).

Figure 7:
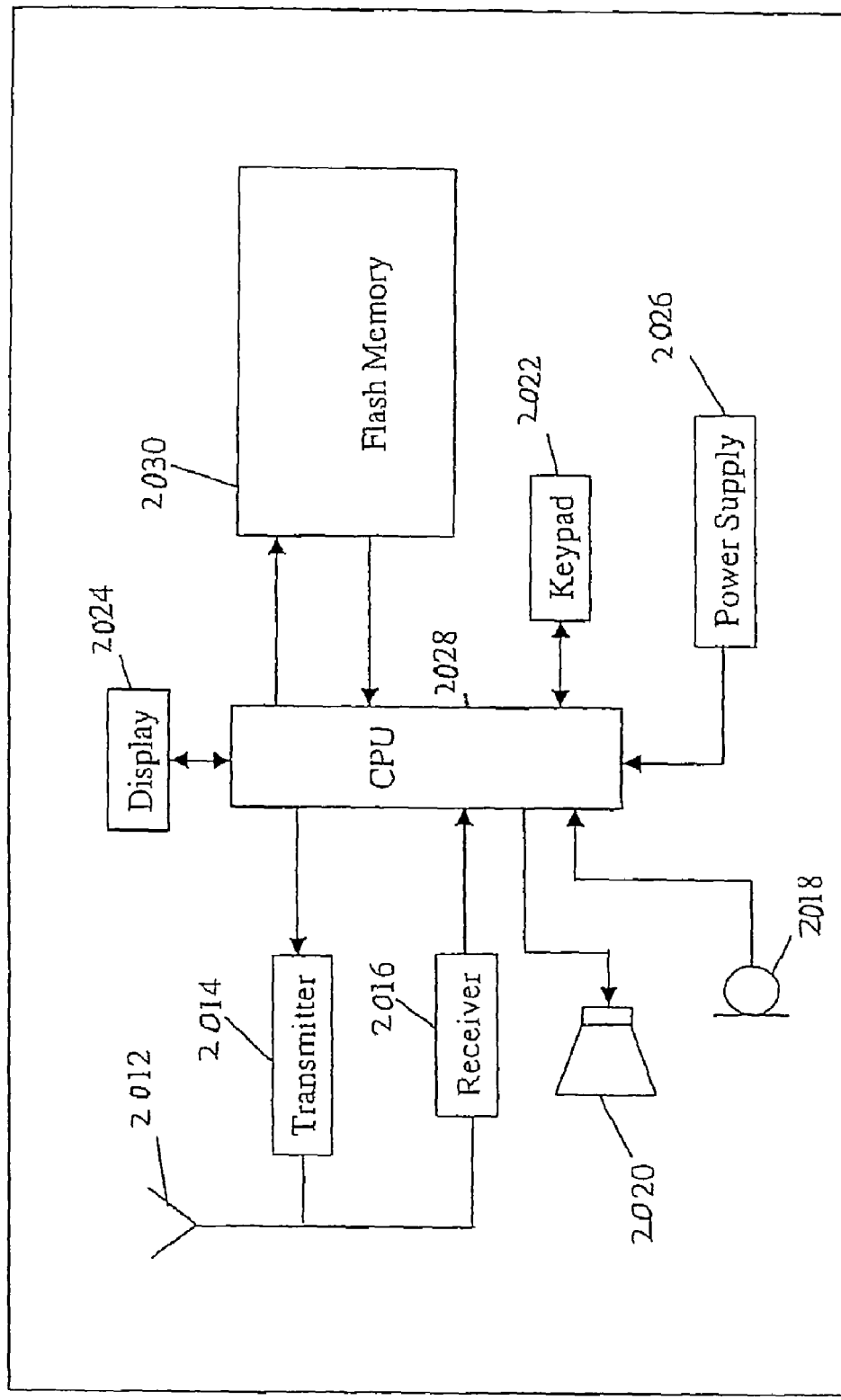
FIG. 7 illustrates a block diagram of a conventional portable phone, upon which embodiments can be implemented.

FIG. 7 shows a block diagram of a conventional portable telephone 2010 (a.k.a. cell phone, cellular phone, mobile phone, internet protocol phone, wireless phone, etc.), upon which embodiments can be implemented. The cell phone 2010 includes an antenna 2012 coupled to a transmitter 2014 a receiver 2016, as well as, a microphone 2018, speaker 2020, keypad 2022, and display 2024. The cell phone 2010 also includes a power supply 2026 and a central processing unit (CPU) 2028, which may be an embedded controller, conventional microprocessor, or the like. In addition, the cell phone 2010 includes integrated, flash memory 2030. Flash memory 2030 includes: a first block address buffer for storing at least one of the block addresses input in accordance with a specified command cycle prior to an access operation for an individual memory cell; and a block redundancy determination section processing redundancy determination in accordance with input of the block address. As a result of this design, the time from access request to individual memory cells to start of the access operation to individual memory cells can be shortened. This improvement in flash memory translates into performance improvements in various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones.

Flash memory comes in two primary varieties, NOR-type flash and NAND-type flash. While the general memory storage transistor is the same for all flash memory, it is the interconnection of the memory cells that differentiates the designs. In a conventional NOR-type flash memory, the memory cell transistors are connected to the bit lines in a parallel configuration, while in a conventional NAND-type flash memory, the memory cell transistors are connected to the bit lines in series. For this reason, NOR-type flash is sometimes referred to as "parallel flash" and NAND-type flash is referred to as "serial flash."

Traditionally, portable phone (e.g., cell phone) CPUs have needed only a small amount of integrated NOR-type flash memory to operate. However, as portable phones (e.g., cell phone) have become more complex, offering more features and more services (e.g., voice service, text messaging, camera, ring tones, email, multimedia, mobile TV, MP3, location, productivity software, multiplayer games, calendar, and maps.), flash memory requirements have steadily increased. Thus, a more efficient flash memory will render a portable phone more competitive in the telecommunications market.

Also, as mentioned above, flash memory is applicable to a variety of devices other than portable phones. For instance, flash memory can be utilized in personal digital assistants, set-top boxes, digital video recorders, networking and telecommunication equipments, printers, computer peripherals, automotive navigation devices, and gaming systems.

Figure 8:
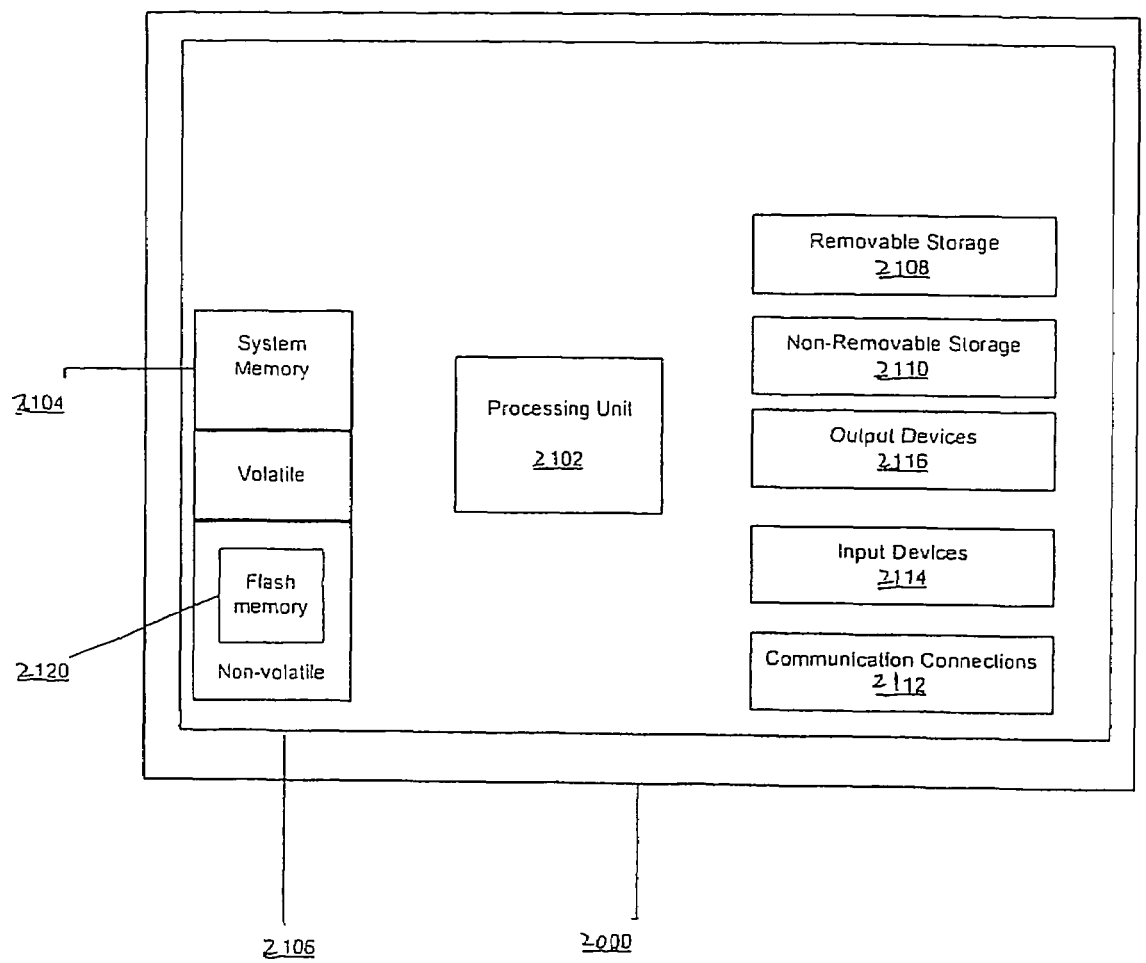
FIG. 8 illustrates a block diagram of a computing device, upon which embodiments of the present claimed subject matter can be implemented.

FIG. 8 illustrates a block diagram of a computing device 2100, upon which embodiments of the present claimed subject matter can be implemented. Although computing device 2100 is shown and described in FIG. 8 as having certain numbers and types of elements, the embodiments are not necessarily limited to the exemplary implementation. That is, computing device 2100 can include elements other than those shown, and can include more than one of the elements that are shown. For example, computing device 2100 can include a greater number of processing units than the one (processing unit 2102) shown. Similarly, in another example, computing device 2100 can include additional components not shown in FIG. 8. components not shown in FIG. 8.

Also, it is important to note that the computing device 2100 can be a variety of things. For example, computing device 2100 can be but are not limited to a personal desktop computer, a portable notebook computer, a personal digital assistant (PDA), and a gaming system. Flash memory is especially useful with small-form-factor computing devices such as PDAs and portable gaming devices. Flash memory offers several advantages. In one example, flash memory is able to offer fast read access times while at the same time being able to withstand shocks and bumps better than standard hard disks. This is important as small computing devices are often moved around and encounters frequent physical impacts. Also, flash memory is more able than other types of memory to withstand intense physical pressure and/or heat. And thus, portable computing devices are able to be used in a greater range of environmental variables.

In its most basic configuration, computing device 2100 typically includes at least one processing unit 2102 and memory 2104. Depending on the exact configuration and type of computing device, memory 2104 may be volatile (such as RAM), non-volatile (such as ROM, flash memory, etc.) or some combination of the two. This most basic configuration of computing device 2100 is illustrated in FIG. 8 by line 2106. Additionally, device 2100 may also have additional features/ functionality. For example, device 2100 may also include additional storage (removable and/or non-removable) including, but not limited to, magnetic or optical disks or tape. In one example, in the context of a gaming system, the removable storage could a game cartridge receiving component utilized to receive different game cartridges. In another example, in the context of a Digital Video Disc (DVD) recorder, the removable storage is a DVD receiving component utilized to receive and read DVDs. Such additional storage is illustrated in FIG. 8 by removable storage 2108 and non-removable storage 2110. Computer storage media includes volatile and nonvolatile, removable and non-removable media implemented in any non-removable media implemented in any method or technology for storage of information such as computer readable instructions, data structures, program modules or other data. Memory 2104, removable storage 2108 and non-removable storage 2110 are all examples of computer storage media. Computer storage media includes, but is not limited to, RAM, ROM, EEPROM, flash memory 2120 or other memory technology, CD-ROM, digital video disks (DVD) or other optical storage, magnetic cassettes, magnetic tape, magnetic disk storage or other magnetic storage devices, or any other medium which can be used to store the desired information and which can accessed by device 2100. Any such computer storage media may be part of device 2100.

In the present embodiment, the flash memory 2120 comprises: a first block address buffer for storing at least one of the block addresses input in accordance with a specified command cycle prior to an access operation for an individual memory cell; and a block redundancy determination section processing redundancy determination in accordance with input of the block address. As a result of this design, the time from access request to individual memory cells to start of the access operation to individual memory cells can be shortened. This improvement in flash memory translates into performance improvements in various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones.

Further, in one embodiment, the flash memory 2120 utilizes mirrorbit technology to allow storing of two physically distinct bits on opposite sides of a memory cell.

Device 2100 may also contain communications connection(s) 2112 that allow the device to communicate with other devices. Communications connection(s) 2112 is an example of communication media. Communication Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. The term computer readable media as used herein includes both storage media and communication media.

Device 2100 may also have input device(s) 2114 such as keyboard, mouse, pen, voice input device, game input device (e.g., a joy stick, a game control pad, and/or other types of game input device), touch input device, etc. Output device(s) 2116 such as a display (e.g., a computer monitor and/or a projection system), speakers, printer, network peripherals, etc., may also be included. All these devices are well know in the art and need not be discussed at length here.

Aside from mobile phones and portable computing devices, flash memory is also widely used in portable multimedia devices, such as portable music players. As users would desire a portable multimedia device to have as large a storage capacity as possible, an increase in memory density would be advantageous. Also, users would also benefit from reduced memory read time.

Figure 9:
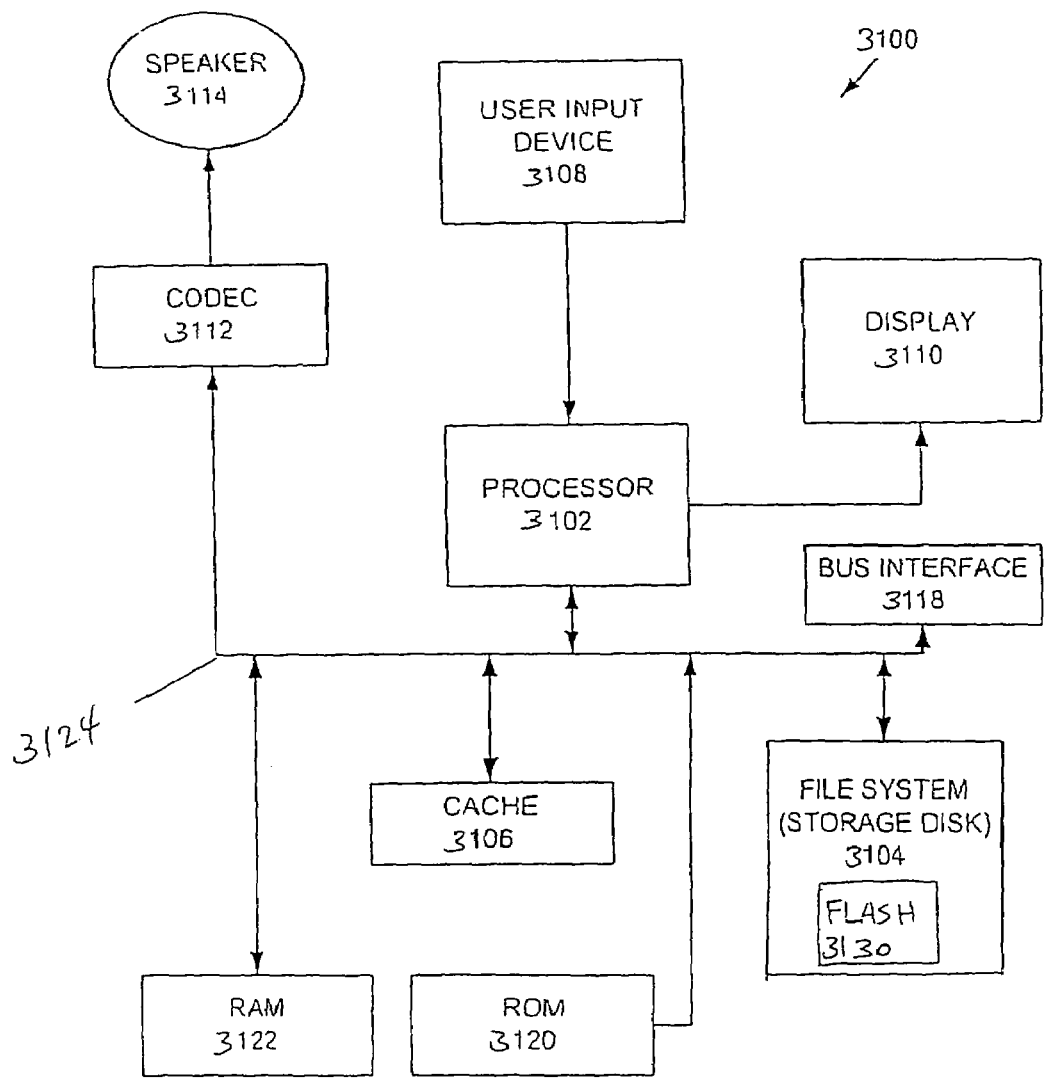
FIG. 9 illustrates an exemplary portable multimedia device, or media player, in accordance with an embodiment of the present claimed subject matter.

FIG. 9 shows an exemplary portable multimedia device, or media player, 3100 in accordance with an embodiment of the invention. The media player 3100 includes a processor 3102 that pertains to a microprocessor or controller for controlling the overall operation of the media player 3100. The media player 3100 stores media data pertaining to media assets in a file system 3104 and a cache 3106. The file system 3104 is, typically, a storage disk or a plurality of disks. The file system 3104 typically provides high 3104 typically provides high capacity storage capability for the media player 3100. Also, file system 3104 includes flash memory 3130. In the present embodiment, the flash memory 3130 comprises: a first block address buffer for storing at least one of the block addresses input in accordance with a specified command cycle prior to an access operation for an individual memory cell; and a block redundancy determination section processing redundancy determination in accordance with input of the block address. As a result of this design, the time from access request to individual memory cells to start of the access operation to individual memory cells can be shortened. This improvement in flash memory translates into performance improvements in various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones.

However, since the access time to the file system 3104 is relatively slow, the media player 3100 can also include a cache 3106. The cache 3106 is, for example, Random-Access Memory (RAM) provided by semiconductor memory. The relative access time to the cache 3106 is substantially shorter than for the file system 3104. However, the cache 3106 does not have the large storage capacity of the file system 3104. Further, the file system 3104, when active, consumes more power than does the cache 3106. The power consumption is particularly important when the media player 3100 is a portable media player that is powered by a battery (not shown). The media player 3100 also includes a RAM 3120 and a Read-Only Memory (ROM) 3122. The ROM 3122 can store programs, utilities or processes to be executed in a non-volatile manner. The RAM 3120 provides volatile data storage, such as for the cache 3106.

The media player 3100 also includes a user input device 3108 that allows a user of the media player 3100 to interact with the media player 3100. 3100. For example, the user input device 3108 can take a variety of forms, such as a button, keypad, dial, etc. Still further, the media player 3100 includes a display 3110 (screen display) that can be controlled by the processor 3102 to display information to the user. A data bus 3124 can facilitate data transfer between at least the file system 3104, the cache 3106, the processor 3102, and the CODEC 3110. The media player 3100 also includes a bus interface 3116 that couples to a data link 3118. The data link 3118 allows the media player 3100 to couple to a host computer.

In one embodiment, the media player 3100 serves to store a plurality of media assets (e.g., songs) in the file system 3104. When a user desires to have the media player play a particular media item, a list of available media assets is displayed on the display 3110. Then, using the user input device 3108, a user can select one of the available media assets. The processor 3102, upon receiving a selection of a particular media item, supplies the media data (e.g., audio file) for the particular media item to a coder/decoder (CODEC) 3110. The CODEC 3110 then produces analog output signals for a speaker 3114. The speaker 3114 can be a speaker internal to the media player 3100 or external to the media player 3100. For example, headphones or earphones that connect to the media player 3100 would be considered an external speaker.

For example, in a particular embodiment, the available media assets are arranged in a hierarchical manner based upon a selected number and type of groupings appropriate to the available media assets. For example, in the case where the media player 3100 is an MP3 type media player, the available media assets take the form of MP3 files (each of which corresponds to a digitally encoded song or other audio rendition) stored at least in part in the file system 3104. The available media assets (or in this case, songs) can be grouped in any manner deemed appropriate. In one arrangement, the songs can be arranged hierarchically as a list of music genres at a first level, a list of artists associated with each genre at a second level, a list of albums for each second level, a list of albums for each artist listed in the second level at a third level, while at a fourth level a list of songs for each album listed in the third level, and so on.

Referring to FIG. 10, the internal configuration of a digital camera 3001 is described. FIG. 10 is a block diagram showing the internal functions of the digital camera 3001. The CCD (image capturing device) 3020 functions as image capturing means for capturing a subject image and generating an electronic image signal and has, for example, 1600 times 1200 pixels. The CCD 3020 photoelectrically converts a light image of the subject formed by the taking lens into image signals (signal made of a signal sequence of pixel signals received by the pixels) of R (red), G (green) and B (blue) pixel by pixel and outputs the image signal.

The image signal obtained from the CCD 3020 is supplied to an analog signal processing circuit 3021. In the analog signal processing circuit 3021, the image signal (analog signal) is subjected to a predetermined analog signal process. The analog signal processing circuit 3021 has a correlated double sampling circuit (CDS) and an automatic gain control circuit (AGC) and adjusts the level of the image signal by performing a process of reducing noise in the image signal by the correlated double sampling circuit and adjusting the gain by the automatic gain control circuit.

An A/D converter 3022 converts each of pixel signals of the image signal into a digital signal of 12 bits. The digital signal obtained by the conversion is temporarily stored as image data in a buffer memory 3054 in a RAM 3050*a*. The image data stored in the buffer memory 3054 is subjected to WB (white balance) process, gamma correction process, color correction process and the like by an image processing unit 3051 and, after that, the processed signal is subjected to a compressing process or the like by a compressing/decompressing unit 3052.

A sound signal obtained from the microphone 3012 is inputted to a sound processing unit 3053. The sound signal inputted to the sound processing unit 3053 is converted into a digital signal by an A/D converter (not shown) provided in the sound processing unit 3053 and the digital signal is temporarily stored in the buffer memory 3054.

An operation unit is an operation unit that can include a power source button and a shutter release button and is used when the user performs an operation of changing a setting state of the digital camera 3001 and an image capturing operation.

A power source 3040 is a power supply source of the digital camera 3001. The digital camera 3001 is driven by using a secondary battery such as a lithium ion battery as the power source battery BT.

An overall control unit 3050 is constructed by a microcomputer having therein the RAM 3050*a* and a ROM 3050*b*. When the microcomputer executes a predetermined program, the overall control unit 3050 functions as a controller for controlling the above-described components in a centralized manner. The overall control unit 3050 also controls, for example, a live view display process and a process of recording data to a memory card. The RAM 3050*a* is a semiconductor memory (such as DRAM) which can be accessed at high speed and the ROM 3050*b* takes the form of, for example, an electrically-rewritable nonvolatile semiconductor memory (such as flash ROM 3050*c*). A flash memory, in one embodiment, includes: a first block address buffer for storing at least one of the block addresses input in accordance with a specified command cycle prior to an access operation for an individual memory cell; and a block redundancy determination section processing redundancy determination in accordance with input of the block address. As a result of this design, the time from access request to individual memory cells to start of the access operation to individual memory cells can be shortened. This improvement in flash memory translates into performance improvements in various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones.

An area as a part of the RAM 3050*a* functions as a buffer area for temporary storing data. This buffer area is referred to as the buffer memory 3054. The buffer memory 3054 temporarily stores image data and sound data.

The overall control unit 3050 has the image processing unit 3051, compressing/decompressing unit 3052 and sound processing unit 3053. The processing units 3051, 3052 and 3053 are function parts realized when the microcomputer executes a predetermined program.

The image processing unit 3051 is a processing unit for performing various digital imaging processes such as WB process and gamma correcting process. The WB process is a process of shifting the level of each of the color components of R, G and B and adjusting color balance. The gamma correcting process is a process of correcting the tone of pixel data. The compressing/decompressing unit 3052 is a processing unit for performing an image data compressing process and an image data decompressing process. As the compressing method, for example, the JPEG method is employed. The sound processing unit 3053 is a processing unit for performing various digital processes on sound data.

A card interface (I/F) 3060 is an interface for writing/reading image data to/from the memory card 3090 inserted into the insertion port in the side face of the digital camera 1. At the time of reading/writing image data from/to the memory card 3090, the process of compressing or decompressing image data is performed according to, for example, the JPEG method in the compressing/decompressing unit 3052, and image data is transmitted/received between the buffer memory 3054 and the memory card 3090 via the card interface 3060. Also at the time of reading/writing sound data, sound data is reading/writing sound data, sound data is transmitted/received between the buffer memory 3054 and the memory card 3090 via the card interface 3060.

Further, by using the card interface 3060, the digital camera 3001 transmits/receives data such as an image and sound and, in addition, can load a program which operates on the digital camera 3001. For example, a control program recorded on the memory card 3090 can be loaded into the RAM 3050*a* or ROM 3050*b* of the overall control unit 3050. In such a manner, the control program can be updated.

Also by communication with an external device (such as an external computer) via a USB terminal, various data such as an image and sound and a control program can be transmitted/received. For example, various data, a program, and the like recorded on a recording medium (CD-R/RW or CD-ROM) which is set into a reader (optical drive device or the like) of the external computer can be obtained via the USB terminal.

The invention is not limited to the illustrated embodiments alone, but may be changed and modified within the scope not departing from the true spirit of the invention.

For example, in FIG. 2, the command system for setting the block address is shown, but this is only an example. Combination of the number of cycles, codes, and terminals to be used may be changed or determined properly.

When the address changeover buffer 13 is disposed, its output intBA is desired to be entered also in the redundancy determination section 7 together with the block address decoder 9. In the internal access operation, too, the determination operation of redundant sector is needed, and this method is simple.

The counter C is not limited to a binary counter, and an initial value of the counter C can be also entered from outside of the storage device as specified address. Address range of the operation of the counter C can be set arbitrarily.

Continuous address operation is not required to be continuous in all blocks of the storage device, but may be continuous only in two or more blocks, and it is not required to be continuous in physically adjacent blocks or logically adjacent blocks.

The effects of the invention are not limited to high speed of word line selection of row selection, but are also obtained in high speed of column selection in the storage device making use of flexible redundancy technology. In the case of flexible redundancy over vertical block rows in a column direction in FIG. 1, which a vertical block should be selected can be determined when an exclusive command cycle is set prior to access operation to individual memory cells.

What is claimed is:

1. A control method in a storage device that comprises a memory cell array comprised of a plurality of blocks, and a redundancy remedy circuit for processing a redundancy remedy in each block, the control method comprising the steps of:

prior to an access operation for an individual memory cell, inputting a block address into a first block address buffer specifying at least one of the blocks that is associated with the individual memory cell and specifying the address of the individual memory cell;

processing a redundancy determination on the input block address prior to the access operation for the individual memory cell;

variably storing a serial block address in a second block address buffer that identifies a block to be accessed during a continuous access operation across blocks; and selecting the first block address buffer during the access operation and the second block address buffer during the continuous access operation.

2. The control method of the storage device of claim 1, wherein the step of inputting the block address includes processing in a specified command cycle, and inputting the block address through a data input/output terminal and/or an address terminal through which an address of the memory cell is specified in the block.

3. The control method of the storage device of claim 1, further comprising the step of holding the input block address.

4. The control method of the storage device of claim 1, further comprising the steps of:

holding the block address;

holding a serial block address instructing the block to be accessed during a continuous access operation over the blocks; and selecting the held block address when the continuous access operation suspending, and selecting the held serial block address when the continuous access operation resuming.

5. A storage device that comprises a memory cell array comprised of a plurality of blocks, and a redundancy remedy circuit for processing a redundancy remedy in each block of the plurality of blocks as one unit for access control, the storage device comprising:

a first block address buffer for storing at least one of the block addresses and an individual memory cell address that are input in accordance with a specified command cycle prior to an access operation for the individual memory cell;

a block redundancy determination section that performs a redundancy determination in accordance with the input of the block address prior to the access operation for the individual memory cell;

a second block address buffer which variably stores a serial block address that identifies a block to be accessed during a continuous access operation across blocks; and a switch section for selecting the first block address buffer during the access operation and the second block address buffer during the continuous access operation.

6. A wireless communications device, said wireless communications device comprising:

a flash memory system comprising:

a first block address buffer for storing at least one of the block addresses and an individual memory cell address that are input in accordance with a specified command cycle prior to an access operation for the individual memory cell; and a block redundancy determination section that performs a redundancy determination in accordance with the input of the block address prior to the access operation for the individual memory cell;

a second block address buffer which variably stores a serial block address that identifies the block to be accessed during a continuous access operation across blocks; and a switch section for selecting the first block address buffer during the access operation and the second block address buffer during the continuous access operation, a processor;

a communications component;

a transmitter;

a receiver; and an antenna connected to the transmitter circuit and the receiver circuit.

7. The wireless communications device of claim 6, wherein said flash memory is NAND flash memory.

8. The wireless communications device of claim 6, wherein said flash memory is NOR flash memory.

9. The wireless communications device of claim 6, wherein said flash memory utilizes dual bit technology.

10. A computing device comprising:

a processor;

an input component;

an output component;

a memory comprising:

a volatile memory; and a flash memory comprising:

a first block address buffer for storing at least one block address and an individual memory cell address that are input in accordance with a specified command cycle prior to an access operation for the individual memory cell; and a block redundancy determination section that performs a redundancy determination in accordance with the input of the block address prior to the access operation for the individual memory cell;

a second block address buffer which variably stores a serial block address that identifies the block to be accessed during a continuous access operation across blocks; and a switch section for selecting the first block address buffer during the access operation in the block, and selecting the second block address buffer during the continuous access operation.

11. The computing device of claim 10, wherein said computing device is a personal computer (PC).

12. The computing device of claim 10, wherein said computing device is a personal digital assistant (PDA).

13. The computing device of claim 10, wherein said computing device is a gaming system.

14. A portable media player comprising:

a processor;

a cache;

a user input component;

a coder-decoder component; and a memory comprising:

a flash memory comprising:

a first block address buffer for storing at least one block address and an individual memory cell address that are input in accordance with a specified command cycle prior to an access operation for the individual memory cell; and a block redundancy determination section that performs a redundancy determination in accordance with input of the block address prior to the access operation for the individual memory cell;

a second block address buffer which variably stores a serial block address instructing the block to be accessed during a continuous access operation across blocks; and a switch section for selecting the first block address buffer during the access operation and the second block address buffer during the continuous access operation.

15. The portable media player of claim 14, wherein said portable media player is a portable music player.

16. The portable media player of claim 14, wherein said portable media player is a portable video player.

17. An image capturing apparatus comprising:

a sensor for providing image data;

a memory capable of storing said image data, comprising:

a first block address buffer for storing at least one block address and an individual memory cell address that are input in accordance with a specified command cycle prior to an access operation for the individual memory cell; and a block redundancy determination section that performs a redundancy determination in accordance with input of the block address prior to the access operation for the individual memory cell;

a second block address buffer which variably stores a serial block address instructing the block to be accessed during a continuous access operation over the blocks; and a switch section for selecting the first block address buffer during the access operation in the block, and selecting the second block address buffer during the continuous access operation operated over the blocks; and a display operable to display an image from said image data.

* * * * *